United States Patent [19]

Steinmaier

[11] 4,270,151
[45] May 26, 1981

[54] MICROPHONE MIXER WITH PREDISTORTION INDICATION

[76] Inventor: Dieter Steinmaier, 12231 Roscoe Blvd., Sun Valley, Calif. 91352

[21] Appl. No.: 950,234

[22] Filed: Oct. 10, 1978

[51] Int. Cl.³ .............................................. G11B 27/36
[52] U.S. Cl. ..................................................... 360/31
[58] Field of Search .............................. 360/31, 68, 65

[56] References Cited

U.S. PATENT DOCUMENTS

| | | | |
|---|---|---|---|
| 2,341,706 | 2/1944 | Fields | 360/31 |
| 3,031,525 | 4/1962 | Oniki | 360/31 |
| 3,659,060 | 4/1972 | Wolft et al. | 360/31 |
| 3,879,751 | 4/1975 | Gimelli | 360/31 |
| 4,092,678 | 5/1978 | Nishikawa | 360/31 |

*Primary Examiner*—Vincent P. Canney

*Attorney, Agent, or Firm*—John E. Wagner

[57] ABSTRACT

A new circuit for giving audible indication to an operator of sound recording equipment impending distortion of audio-signals. The circuit includes a predistortion circuit which introduces distortion into a monitor circuit at a predetermined level below saturation and distortion of the primary channel thus allowing the operator to adjust the gain in the primary channel to avoid distortion on the channel as finally recorded. The invention employs a clipping circuit and amplifier in a branch channel from the principal signal channel. The branch channel including its distortion circuitry is set at a predetermined level with respect to the distortion in the primary channel. A visual indication of distortion is also available in the form of an L.E.D. display.

4 Claims, 9 Drawing Figures

FIG. 8
⊥ AMP GROUND
⏚ CASE GROUND
▽ SUPPLY GROUND
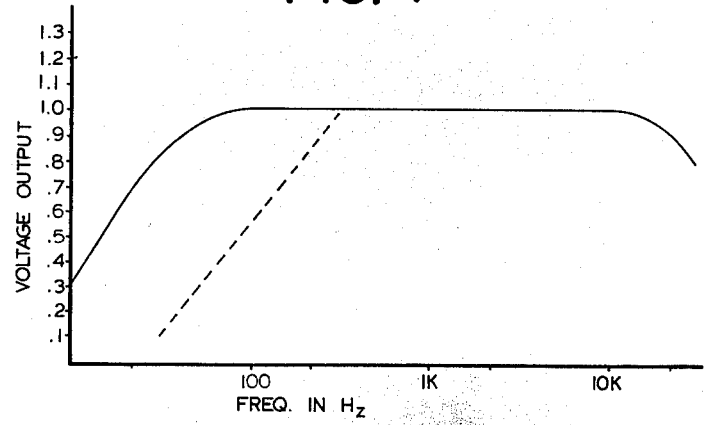
FIG. 7
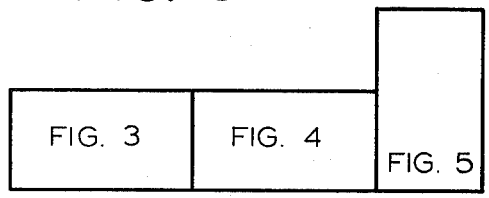
FIG. 6
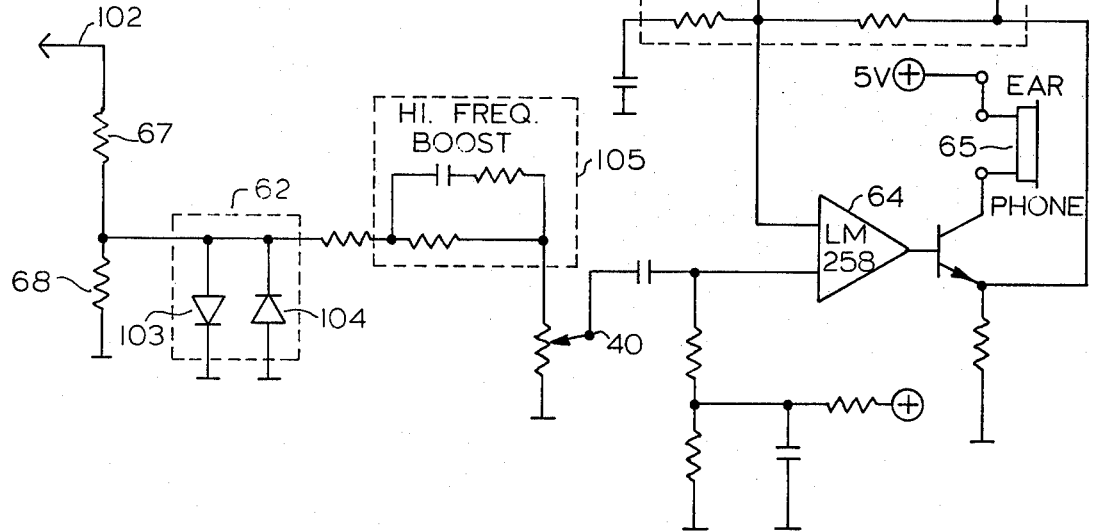
FIG. 5

MICROPHONE MIXER WITH PREDISTORTION INDICATION

BACKGROUND OF THE INVENTION

The setting of gain of an audio channel and of the mixing of multiple channels prior to recording is an extremely important function in the recording of music and sounds and speech, particularly in the television industry where video cameramen with recorders commonly go to the scene of a newsworthy event and record visually and in audio form the event, often working under extreme conditions. The cameraman may be his own audio man as well and his full attention, particularly visually, is concentrated upon the video camera, where he can not look at a common vu-meter.

In the case where a scene is recorded simultaneously in video and audio, any distortion in the audio channel greatly diminishes the acceptability of the recording produced. Once recorded, the distortion is virtually impossible to eliminate. Attempts made after the fact to correct distortion have met with little success. Another approach is merely to maintain gain at such a level to insure freedom from distortion, however, this often results in reduction or loss of good audio signal, due to high noise levels. Since the signal should be amplified above the noise level as high as possible without overloading any part of the recording channel which would result in distortion.

Other types of mixing circuits have employed automatic gain control, but I have found that automatic gain control does not provide a maximum usable undistorted good signal above noise level.

Predistortion circuits have been used in a number of applications usually in the signal channel e.g. Dolby Systems, however, not in a branch control channel.

BRIEF STATEMENT OF THE INVENTION

I have developed an improved preamplifier audio mixer and level control circuit suitable for one-man, on-the-scene recording of audio signals. It employs basically a conventional preamplifier stage which is coupled to the source of audio information e.g. microphone. The preamplifier stage may be duplicated one preamplifier for each audio input if desired, or may be used as a single stage with a single audio source. In the case of multiple sources a summing amplifier is used in the audio channel.

Branching off of the last stage of the information channel into a monitor channel employing its own amplifier and a clipping circuit comprising a pair of oppositely poled diodes which introduce distortion into that branch if levels exceed predetermined value in the last amplifier stage or if a fixed gain is employed in any of the preamplifier stages. The monitor branch circuit employs a suitable amplifier for the headphone set and volume control and optional frequency compensation circuitry to match the compensation to the main signal channel.

Further, an optional level meter is available to show signal input levels and also may double as a battery condition monitor.

The circuit of this invention is incorporated principally as a portable battery-powered unit. The principal outputs for the user are earphones and the jack for output of the audio signal for the main channel.

BRIEF DESCRIPTION OF THE DRAWINGS

This invention may be more clearly seen from the following detailed description and by reference to the drawings in which:

FIGS. 3, 4, and 5 constitute an electrical schematic diagram of this invention;

FIG. 6 is a layout diagram for FIGS. 3, 4, and 5;

FIG. 8 is a symbol chart; and

FIGS. 7, and 9 are a graphical representations of the frequency and signal response characteristics of this invention.

DETAILED DESCRIPTION OF THE INVENTION

Figure 1:
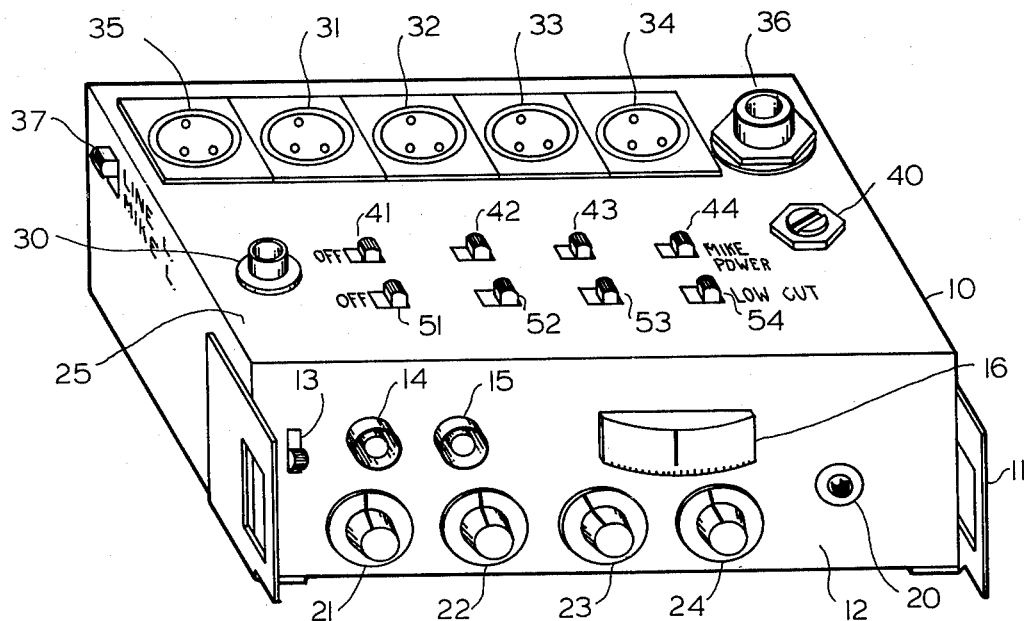
FIG. 1 is a perspective view of a physical embodiment of this invention.

This invention is designed particularly as a portable battery powered unit all self-contained within an enclosure which may be carried on a strap over the shoulder of a one-man video/audio crew to control the audio channels or channel during filming. The invention in its physical embodiment is best shown in FIG. 1 includes an external housing 10 having a pair of hangers 11 designed to receive a strap unshown and to be carried from the shoulder. On the upper side 12 of the apparatus, when in operation, there is an ON/OFF switch 13, a battery test switch 14, a line up tone switch 15, and VU meter 16 for indicating battery condition and giving an indication of magnitude of audio levels. Other operating controls on side 12 are in the form of a light emitting diode L.E.D. 20 and a plurality of individual volume controls 21 through 24 which are used by the operator in setting the appropriate level of audio signals on one or more channels which may be used.

The outer face 25 of the housing 10 may be seen as including a jack 30 for external power, jacks or recepticles 31 through 34 for receiving microphone plugs. Commonly the multiple jacks or recepticles 31-34 are used to accept multiple microphones or microphones of common impedance levels between 50 to 250 Ohms. Standard XLR type connectors are employed and recommended. Associated with each respective recepticle 31 and 34 is a microphone power switch 41 through 44 and a respective low frequency compensation switch 51 through 54.

An individual signal output jack 36 with its associates level selector switch 37 is present on the outer face 25 as well as a headset jack 36 and a headset volume control 40. Level selector switch 37 when in the up position, provides output at line level, and when down, at microphone level e.g. 10 Mv/200 Ohms.

As shown in FIG. 1 the entire assembly is self-powered from internal batteries and can provide phantom power for microphones so as particular value as a simple compact pre-amplifier mixer.

Figure 2:
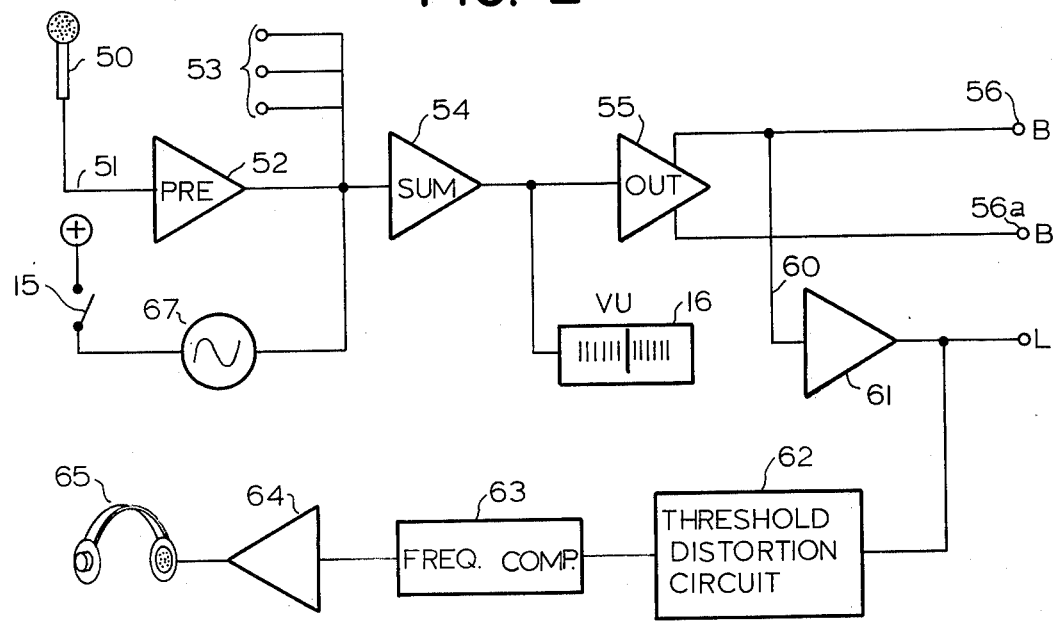
FIG. 2 is a block diagram of an audio recording system employing this invention.

Now referring to FIG. 2—showing this invention in block diagram form. A microphone 50 is connected via its lead 51 to pre-amplifier stage 52 where it is introduced in parallel with a number of other channels indicated by leads 53 from jacks 31-34 of FIG. 1 into a summing amplifier 54 which is coupled to an output stage 55 providing a balanced microphone level output on terminals 56 and 56a. Unbalanced line level output is provided via stage 61 and output terminal L. The terminals 56 and 56a are normally connected to a tape recorder or other type of audio recording device. In the most useful application the output terminals 56 are connected to a separate tape recorder or to the audio channel of a video/audio recorder.

Tapped from the line output stage 61 over lead 60 is the audio signal which is introduced into a threshold distortion circuit 62. This circuit 62 provides undistorted signal throughout when the signal is below a predetermined amplitude level and distorts the signal when it exceeds the predetermined level. After passing through the threshold distortion circuit the signal can be frequency compensated by bass and high frequency boost in circuit 63 and thereafter amplified in output stage 64 and introduced into the user's earphone set 65. An unbalanced amplified line level output is available at terminal L following amplifier 61.

In addition to the straight through signal path to terminals 56 and 56a L which was traced above and the distortion signal path to earphones 65, the circuit includes a visual indicator in the form of VU meter 16 coupled to the primary signal channel preferably between the summing amplifier 54 and the output stage 55.

The circuit also includes a tone oscillator 67 which is coupled via switch 15 into the signal channel ahead of the summing amplifier 54 to provide a line up signal whenever desired. Oscillator 67 typically produces a known frequency of 1000 Hz which reaches the output terminals 56 and earphones 65 via the same channels through which normal audio signals are handled.

Figure 3:
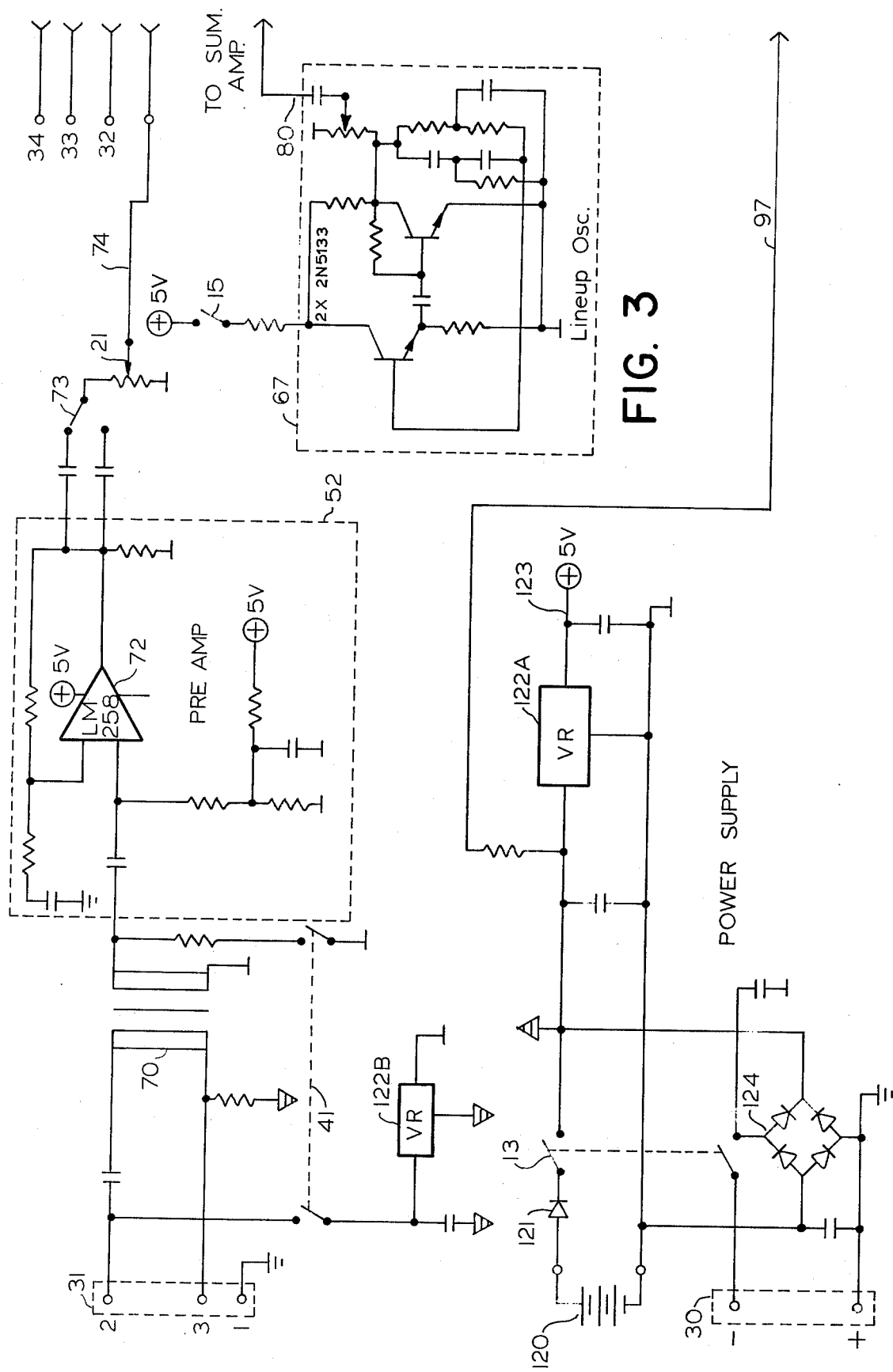
Figure 4:
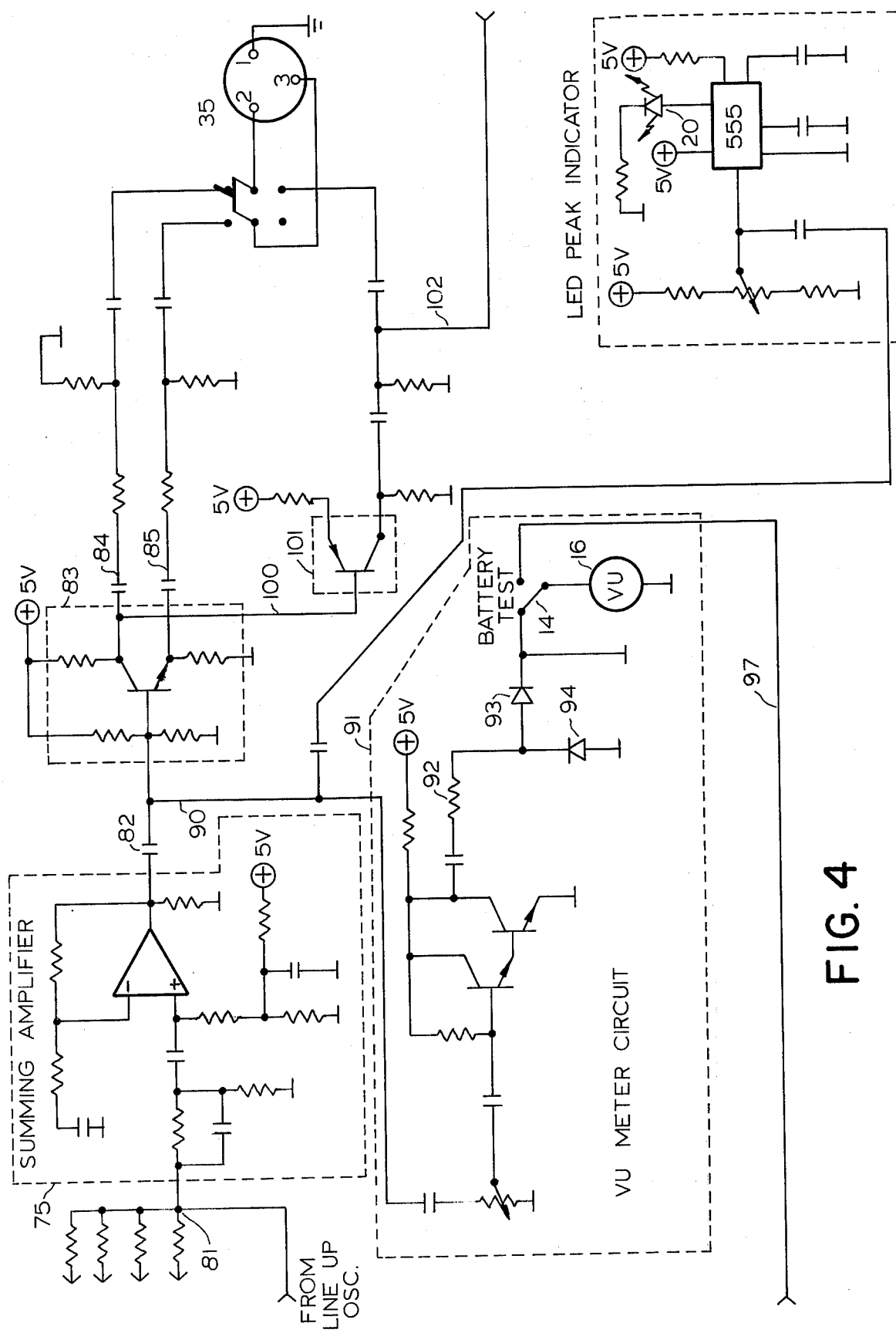

The details of this invention will now be seen in more detail in FIGS. 3, 4, and 5, constituting the electrical schematic diagram of one particular embodiment of this invention. Referring now to FIG. 3—the three terminals labelled 1, 2, and 3 of the jack 31 are connected, terminal 1 to ground and terminals 2 and 3 via audio frequency transformer 70 to preamplifier 52. The signal is coupled from preamplifier 52 via capacitors, switch 73, volume control 21, lead 74 to summing amplifier 75. Parallel inputs 32–34 also provide additional signals to summing amplifier 75. Also coupled to the input of the summing amplifier 75 is the output of line up oscillator 67 operating at, for example, 1 khz and providing a tone to the circuit whenever switch 15 is closed. This tone signal is provided over lead 80 to the junction 81 at the input of summing amplifier 75. The amplifier 75 is followed by coupling capacitor 82 and a balanced output stage 83 providing a pair of output leads 84 and 85 which together constitute the balanced output line terminating at terminal 56.

Coupled between the summing amplifier and the balanced output stage in addition to the coupling capacitor 82 is a branch lead 90 to a VU meter circuit 91 including appropriate amplifier stages and averaging circuitry on rectifying diodes 93 and 94 serving the VU meter 16. Switch 14 is shown in its normal condition with the VU meter 16 connected effectively to the main signal channel. Thus, the VU meter 16 normally indicates audio level in accordance with well known practice in the art. The other position of switch 14 is to battery test which is connected via lead 97 and a resistor to the power supply 98 to measure the terminal voltage of the battery 120. Thus, the meter 16 serves a dual function.

PREDISTORTION INDICATION CIRCUIT

A second branch from the main signal channel is lead 100 which samples the main signal and is used via an amplifier stage 101 to provide an unbalanced line output selected by switch 37 to jack 35 of FIG. 1. A second branch off lead 102 couples the sampled line level output signal to threshold distortion circuit 62 in the form of a pair oppositely poled diodes 103 and 104 to ground. These diodes typically conduct at a predetermined level depending upon their material or manufacturer at a voltage of 0.3 or 0.7 and above that level of greater voltage they appear as direct short circuits to signal levels. Diode types 2N4148 are satisfactory for this purpose.

Above that level diodes 103 and 104 break down in the forward direction and cause clipping of the peaks of signals reaching the distortion circuit 62. It is in this threshold clipping area where the true value of this circuit is most apparent. This circuitry allows the user to adjust to just detectable clipping and full well knows that a good clean signal is going out the balanced output line and on the unbalanced line.

The signal to be recorded on the balanced line of FIG. 4 should never be greater in amplitude than the following recorder (amplifier stage) as the previous amplifier is capable of processing without distortion. Distortion can be caused by overdriving the amplifier following or saturation of the recording tape.

Figure 9:
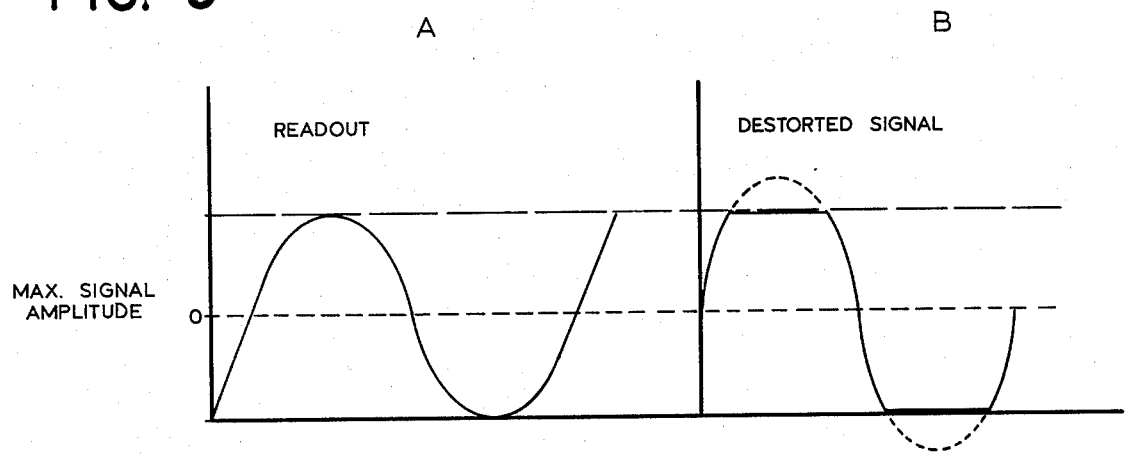
Figure 9:
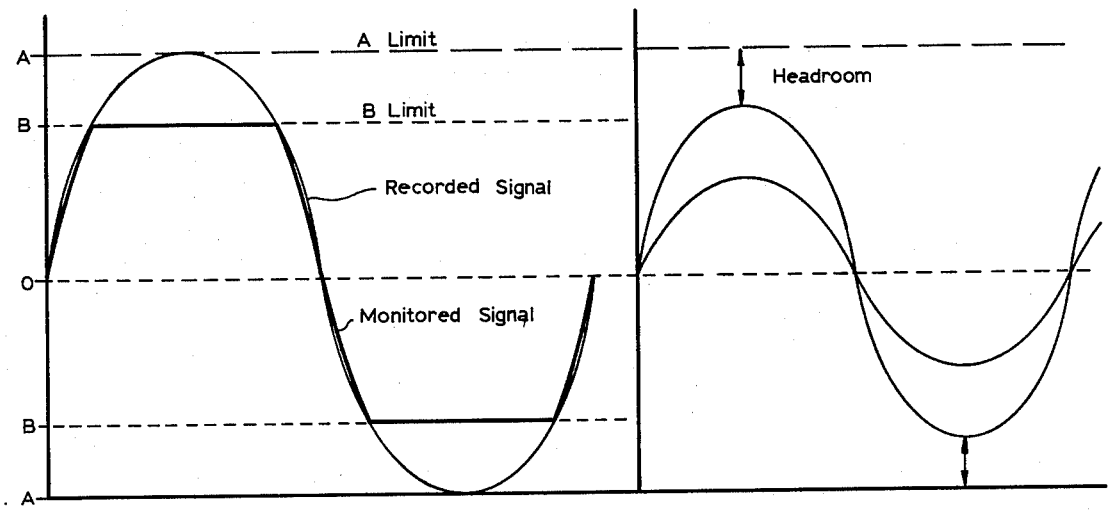

The signal should, for example, never be greater in amplitude than 4 volts peak-to-peak since this would cause distortion shown in curves A and B of FIG. 9.

By choosing the proper values for resistors 67 and 68 which are used as a voltage divider, we can attenuate the signal being on Line 102 to any amplitude smaller than signal A across resistor 68.

The Diodes 62 (103 and 104) conduct whenever the amplitude of the signal across resistor 68 reaches the forward breakdown voltage of the diodes typical of 0.7 volts or 0.3 depending on the diode material. This limits the amplitude of the signal across 68 by clipping signals larger than the forward breakdown voltage of the diodes 62.

For example, the maximum allowed signal amplitude on Line 102 is 4 volts peak-to-peak. The distortion in the headset 65 should occur when that signal A reaches 2 volts peak-to-peak. Voltage divider 67-68 have to divide that signal to 0.7 volts across 68 when signal A is 2 volts. This will cause Signal B to be clipped whenever Signal A is greater than 2 volts. The greater Signal A, the more clipping and more distorting is introduced in Signal B feeding a headset amplifier 64 of FIG. 5 through a volume control. The operator will detect that distortion and will reduce his gain settings and restore his headroom as is illustrated in curves C and C1 of FIG. 9.

The signal A which has reached the tape recorder and is recorded has never reached the maximum amplitude of 4 volts because the operator has prevented that in time. Before this, the signal A was too low in amplitude to cause distortion. The recorded sound on the tape is undistorted.

In order to provide to the user the proper signals so that he can readily detect distortion, a final stage amplifier is employed including frequency compensation in the form of high frequency boost circuit 105 a bass boost circuit 106.

The circuitry of this invention is readily portable and useable with minimum distraction for the user by reason of the effective design with the only operational controls and indicators located on the small top surface 10. Setup controls are on the side away from the user. It must be brought to mind, however, that operation once the appropriate controls are set, involves merely the operator listening for distortion and when he encounters distortion reduce the gain on one of the appropriate one of the four controls 21 through 24. If he is only using channel 1 then his attention by his hand only need be directed to the first knob. When distortion no longer appears at his earphones then he can always be assured that a good clean signal is reaching the recorder or whatever sound device he may be using.

POWER SUPPLY

The versatility of this device is obtained in part, due to the fact that it is totally self-contained including batteries and is equipped for external power supply with automatic switchover in the event that the external source fails. The power supply appears in FIG. 3 is including batteries 120 coupled through a blocking diode 121 to protect the circuitry from polarity reversals and the on/off switch 13 to a voltage regulator circuit 122 (reccommended type LM 240) supplying a stable voltage to a common 5 volt bus 123. The circuitry is also served by external DC power source jack 30 diode rectifier 12, enables the user to switch polarity for use with positive or negative ground equipment.

Likewise this mixer is compatable simultaneously with positive or negative ground equipment since it includes its own isolation circuits as denoted in the drawing, FIGS. 3-5 using the three different ground connection symbols as shown in FIG. 8.

SUMMARY

The above description is that of the typical application of my invention and in fact is the preferred embodiment with which I am familiar. It must be recognized that pre-amplifiers, power supplies, summing circuits per se, are well known in the art in general and particularly in the audio mixer field. Therefore, my invention is not of the scope of or limited to the circuitry as set forth in the above description, but rather to my invention which is defined in the following claims as to each essential component and their equivalent.

What is claimed is:

1. A control circuit for minimizing distortion in a recorded or reproduced audio signal comprising:
    means defining a signal channel including input terminals for receiving an audio signal to be recorded or reproduced and output terminals therefor,
    said signal channel defining means including a preamplifier for audio input signals and an output stage for producing an output of audio signals to said output terminals;
    means defining a control channel coupled to said signal channel including means for continuously monitoring said audio signal,
    said control channel including a distortion circuit for selectively introducing distortion into the monitored audio signal in said control channel,
    audio output means for use by the user of the equipment connected to the output of said distortion circuit,
    said distortion circuit having a predetermined threshold below which input signals thereto pass virtually undistorted and above which are audibly distorted simulating distortion in the audio signal if recorded or reproduced under present conditions,
    said threshold corresponding to a fixed level differential with respect to the distortion level of said signal channel.

2. The combination in accordance with claim 1 wherein said distortion circuit comprises a clipping circuit for introducing overload distortion into the peaks of signals in the control channel thereby simulating overload distortion in the audio signal when recorded or reproduced.

3. The combination in accordance with claim 2 wherein the clipping circuit comprises a pair of oppositely poled diodes in the control channel for clipping both positive and negative peaks of signals in the control channel.

4. The combination in accordance with claim 1 wherein said control channel includes frequency compensation circuitry for producing an undistorted output signal corresponding to the undistorted output signal of the balanced channel.

* * * * *